United States Patent [19]
Vis

[11] Patent Number: 4,683,702
[45] Date of Patent: Aug. 4, 1987

[54] METHOD FOR VACUUM-PACKAGING FINELY DIVIDED MATERIALS, AND A BAG FOR IMPLEMENTING THE METHOD

[75] Inventor: Benjamin Vis, Gavirate, Italy

[73] Assignee: U.S. Philips Corporation, New York, N.Y.

[21] Appl. No.: 737,295

[22] Filed: May 23, 1985

[30] Foreign Application Priority Data

May 23, 1984 [IT] Italy ................................ 21053 A/84

[51] Int. Cl.[4] ............................................. B65B 31/04
[52] U.S. Cl. ........................................ 53/433; 53/449;
53/452; 206/524.8; 383/102
[58] Field of Search .................... 53/79, 170, 403, 405,
53/433, 434, 449, 452, 453, 511, 559, 558;
206/524.8; 222/94; 383/102

[56] References Cited

U.S. PATENT DOCUMENTS 4,172,152 10/1979 Carlisle .................................. 53/434
4,513,015 4/1985 Clough .................................. 53/434

FOREIGN PATENT DOCUMENTS 654570 6/1963 Italy .................................. 206/524.8

Primary Examiner—Robert L. Spruill
Assistant Examiner—Donald R. Studebaker
Attorney, Agent, or Firm—Thomas A. Briody; William J. Streeter; Rolf E. Schneider

[57] ABSTRACT

A method for vacuum-packaging a powdered material comprises providing a first gas-impermeable sheet, a second gas-impermeable sheet, and a gas-permeable sheet, the three sheets being substantially rectangular in shape and the gas-permeable sheet having smaller dimensions than the gas-impermeable sheets, the gas-permeable sheet being impermeable to the powdered material. The gas-permeable sheet is positioned on the first gas-impermeable sheet such that the latter peripherally overlaps the former; and one edge of the gas-permeable sheet is sealed to the corresponding edge of the gas-impermeable sheet. The second gas-impermeable sheet is positioned on the opposite side of the gas-permeable sheet such that the former similarly peripherally overlaps the latter. The three sheets are sealed together along their opposed edges respectively perpendicular to the first sealed edge. The powdered material is introduced at atmospheric pressure into the resulting space between the gas-permeable sheet and the first gas-impermeable sheet; and the three sheets are sealed together along their corresponding edges opposite the first sealed edge. A vacuum is applied to the opposite side of the gas-permeable sheet to extract therethrough gas from the powdered material. The remaining edge of the second gas-impermeable sheet is sealed to the corresponding edges of the other two sheets while such vacuum continues to be applied to the gas-permeable sheet.

2 Claims, 7 Drawing Figures

METHOD FOR VACUUM-PACKAGING FINELY DIVIDED MATERIALS, AND A BAG FOR IMPLEMENTING THE METHOD

This invention relates to a method for vacuum-packaging finely divided materials, and to a bag for implementing such method.

In the vacuum-packaging of pulverulent materials or products, a method is known consisting of: (a) loading a given quantity of the product into an air-impermeable, multi-layer thermoweldable bag through its open mouth; (b) placing the bag in an environment in which a vacuum is created by means of a pump; and (c) closing the mouth by thermowelding while the environment is still under vacuum.

In a modification of this method, the bag is closed at atmospheric pressure after loading the pulverulent product, after which it is put under vacuum by way of a preferably unidirectional valve provided with a filter, this valve being present on the bag.

Such a method is quite satisfactory when the product particles do not fall below a certain size, but is not satisfactory when they are extremely fine, for example smaller than 100 Å. This is because a small but appreciable quantity of powder is sucked from the bag or container and deposits, according to the particular case, either in the valve (which is in practice thus made inoperable) or on the rim of the bag mouth (which does not ensure perfect closure of the mouth), and also on any filter disposed downstream of the vacuum pump, and which therefore rapidly becomes inefficient. If the bag is of large volume, there is also the practical drawback that the time necessary for putting it under a vacuum is very long, perhaps even several hours, because of the pressure drop due to the presence of the filter in the valve, which is already of small diameter. Consequently, this method is of little industrial importance in the case of very fine powders.

The main object of the present invention is to provide a method and container which allow the vacuum-packaging of products in the form of a very fine powder without the aforesaid drawbacks.

Powders with a degree of fineness such as not to allow conventional packaging include silica-based powders used for producing thermal insulation, such as described in U.S. Pat. No. 4,159,359, where the insulation efficiency depends on the extreme fineness of the powder. In the particular application described in this patent, the powder is converted into compact bodies, for example into sheets, by mechanical compression. Because of the powder fineness, the mechanical compaction involves considerable technical difficulties that need to be overcome. To overcome these difficulties it has already been proposed to package such a powder into bags or similar containers and to use these latter thus filled as insulating bodies for the most widespread applications. For the initially stated reasons, this packaging is carried out at atmospheric pressure, and thus there is inadequate utilisation of the insulating properties of such powder, which increase substantially as the pressure is reduced below atmospheric. A further important object of the present invention is therefore to provide a vacuum-packaging method, and the corresponding package, for very fine insulating powders which take full advantage of their insulating characteristics without suffering the drawbacks of the initially described methods and packages, to obtain composite insulating bodies for the most varied applications, for example as insulation components fr constituents of domestic refrigerators.

According to the invention, the method for vacuum-packaging products in the form of a powder consists of enclosing the product at atmospheric pressure in a bag having a wall which is partly permeable to air or other gases but not to the powdery product; extracting the air or other gas from the product through such wall by applying vacuum and, while the vacuum is still present, covering the permeable wall by means of an impermeable wall. The bag according to the invention is characterized by comprising at least one chamber enclosing the product and partly bounded by a wall which is permeable to air but not to the product, on which wall there is superposed an impermeable wall so as to seal the former.

The invention will now be described in connection with the accompanying drawings, in which.

Figure 1:
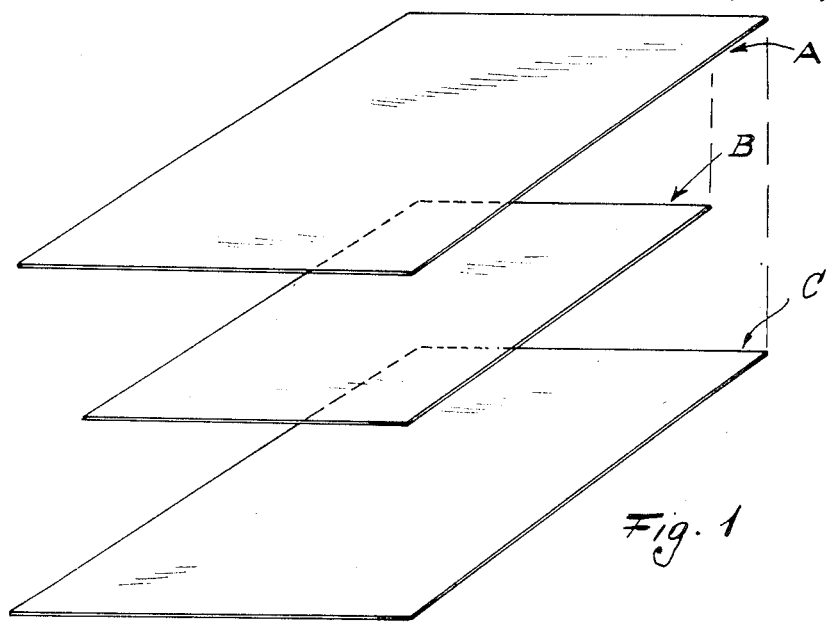
FIG. 1 is an exploded perspective view of the three constituent sheets of the container (flexible bag) of the invention before being joined together.
Figure 2:
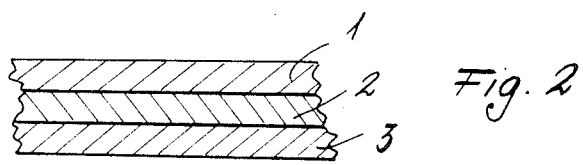
FIG. 2 is a partial sectional view on an enlarged scale through one of the outer sheets.

With reference to the Figures, the container shown is a bag formed from three rectangular or square flexible sheets A, B and C (FIG. 1) which are placed in superposed relationship so that the sheet B is interposed between the other two sheets A, C. The sheet B is of paper or analogous material possessing filtering properties such as to retain the particles of the fed product. A possible example is chemical laboratory filter paper or the paper used in motor vehicle air filters. The other two sheets A and C, preferably of identical nature, must in contrast be impermeable to air or other gases so as to enable the vacuum to remain be retained inside the container, and must be thermoweldable. For example the sheets A and C, which are each shown in greatly enlarged cross-section in FIG. 2, are each formed from three layers 1, 2 and 3 of polyethylene, aluminium and nylon respectively, these being joined together by known methods, for example by adhesives. The layer which is to be located internally in the container is the polyethylene layer, i.e. a thermoweldable material. A polyester can be used instead of the nylon, and polypropylene instead of the polyethylene. The layers can also be of a number different from that indicated, and in particular only two in number. Layers have in fact been formed in which the polyethylene thickness was 90 microns, the aluminium thickness 10 microns and the nylon thickness 13 microns.

Figure 2A:
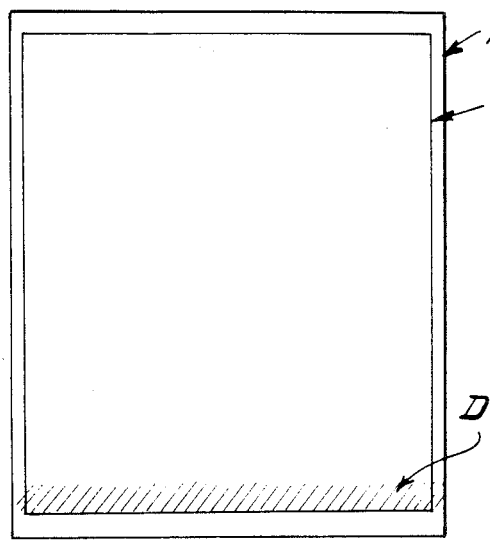
FIG. 2A is a front view of the intermediate sheet and of one of the outer sheets after they have been joined together by a transverse weld at their bases.

The intermediate filtering sheet B is of slightly smaller dimensions than the other two sheets for the reasons given hereinafter. The sheet B is centered and rested on the thermoweldable layer of one of the other two sheets, for example the sheet A, and is joined to the latter by a thermoweld D shown by a hatching zone in FIG. 2A and extending over the entire lower transverse edge of the intermediate sheet B. The thermoweld is made by means of mobile bars 4 such as those shown in FIG. 4, which are heated by thermostatically controlled electrical resistance heaters, such bars squeezing together the sheet zones to be welded. The sheet C is then centered on this assembly so that its thermoweldable polyethylene layer rests on the intermediate filtering sheet B. The welding bars 4 are then used to make two thermowelds, indicated by hatching and by the reference latters E and F in FIG. 3, which are parallel to each other and extend along the two longitudinal edges of the three sheets to join together all three sheets as shown in cross-section in FIG. 4. As the intermediate filtering sheet B is smaller than the over sheets and the welding zones E, F extend both other parts where the three sheets are superposed and over parts where only the two outer sheets A and C are superposed (again see FIG. 4), the edge G of the intermediate sheet does not communicate with the external environment, and instead is sealed therefrom by the projecting ends of the two outer sheets. In this manner it is not possible to lose the vacuum by air infiltration along the edges of intermediate sheet B which, as stated, is permeable to air.

Figure 3:
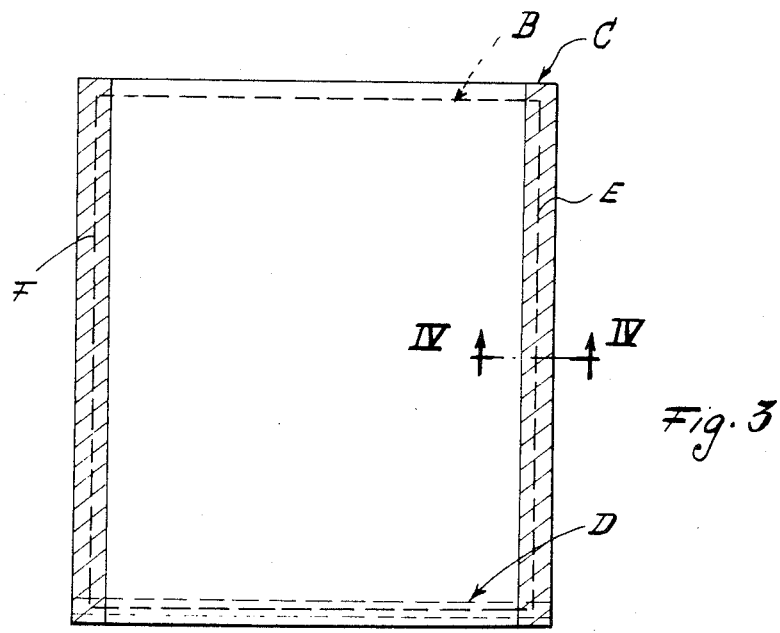
FIG. 3 is a front view of the three sheets joined together by thermowelding along two opposite longitudinal edges.
Figure 4:
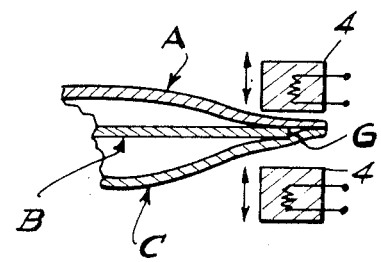
FIG. 4 is a partial sectional view taken on the line IV-IV of FIG. 3, diagrammatically showing the mobile welding bars which form the welds along the longitudinal edges of the sheets.
Figure 5:
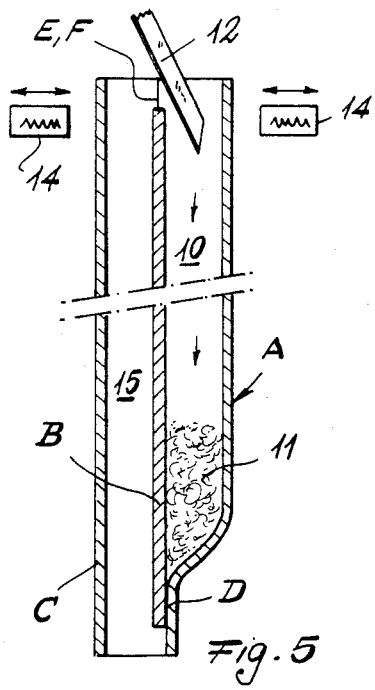
FIG. 5 is a longitudinal sectional view on an enlarged scale through the container obtained after the welding operations of FIGS. 2A, 3 and 4, shown during its filling with the product in the form of fine powder.

By means of the described operations, a container is obtained in the form of a flexible bag having a cross-section as shown in FIG. 5, and comprising a first upwardly open chamber 10 defined by the intermediate sheet B and the outer sheet A, and a second chamber 15 is open at both ends. The container is placed upright in a mould 13 (see FIG. 6) and the finely divided product 11 is loaded into the chamber 10 by any known means, which is here represented diagrammatically by a mobile nozzle 12 connected to a supply of the product. Using a pair of mobile welding bars indicated by 14 in FIG. 5, an upper transverse thermoweld M is produced by means of which access to the chamber 10 is closed and the upper end of the chamber 15 is also simultaneously closed, these chambers thus being kept separated only by the intermediate filtering wall B. The transverse weld M is thus made to produce the same results as those described for the two longitudinal welds E, F as shown in FIGS. 3 and 4.

Figure 6:
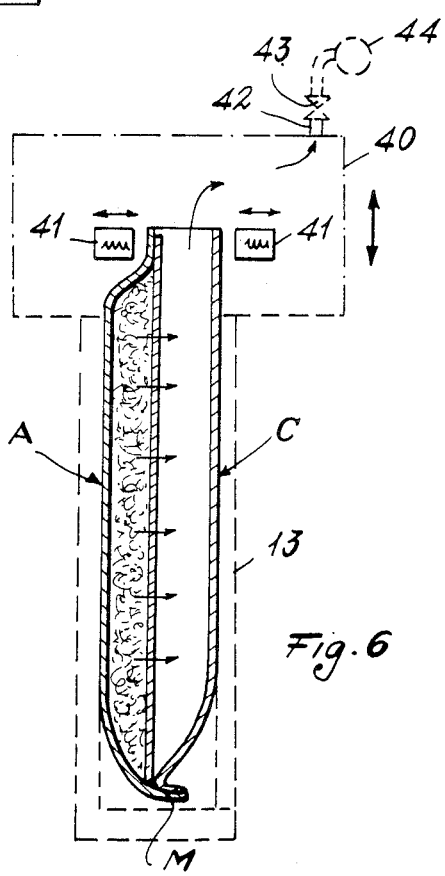
FIG. 6 shows its container of FIG. 5 after welding the product filling mouth and placement in an evacuation hood, but before its final closure.

The resultant container is extracted from the mould 13 and re-inserted therein in an inverted position as shown in FIG. 6. By making the mould 13 in the form of two half-moulds joined along a vertical plane and provided with suitably shaped lower edges, the operational stage about to be described can also be carried out while keeping the container (bag) in the same position as during those stages of the method described heretofore, i.e. without inverting it. A movable hood 40 containing a pair of mobile welding bars 41 is placed on this mould in a sealed manner, and is connected by way of a pipe 42 and control valve 43 to a source of vacuum 44. On opening the valve 43, the space defined by the hood 40 and the mould 13 is put under a vacuum, and the air contained between the particles of the product 11 present in the chamber 10 escapes from the latter through the permeable filtering wall formed by the intermediate sheet B, to reach the upwardly open chamber 15 and to be drawn to the vacuum source 44. After a certain time, and while still maintaining the vacuum, the welding bars 41 are tightened against the upper end of the container to produce a transverse weld extending over the entire width of the container and incorporating the edge of the intermediate sheet B in a manner analogous to that shown in FIG. 4. The container is thus hermetically sealed and is ready for use.

To facilitate elimination of air from the product where this is not subject to thermal degradation, the invention also provides the possibility of heating the bag and/or mould which surrounds it, during the evacuation stage. This can be done for example by incorporating resistance heaters in the mould.

One aspect of the invention is the particular application of the container according to the invention as a component or constituent of the thermal insulation of refrigerators, particularly domestic refrigerators, when the product contained in it is in the form of fine powder, the insulating capacity of which depends substantially on the degree of vacuum of the environment in which it is located. Examples of such powder are silica-based powders such as those described in the above-mentioned United States patent. In such an application the container or containers of the invention are disposed in the interspace or interspaces between the inner liner and the outer housing which define the refrigerator cabinet structure and are secured therein.

What is claimed is:

1. A method for vacuum-packaging a powedered material, which comprises providing a first gas-impermeable sheet, a second gas-impermeable sheet, and a gas-permeable sheet, the three sheets being substantially rectangular in shape and the gas-permeable sheet having smaller dimensions than the gas-impermeable sheets, the gas-permeable sheet being impermeable to the powdered material; positioning the gas-permeable sheet on the first gas-impermeable sheet such that the latter peripherally overlaps the former; sealing one edge of the gas-permeable sheet to the corresponding edge of the gas-impermeable sheet; positioning the second gas-impermeable sheet on the opposite side of the gas-permeable sheet such that the former similarly peripherally overlaps the latter; sealing the three sheets together along their opposed edges respectively perpendicular to the first sealed edge; introducing the powdered material at atmospheric pressure into the resulting space between the gas-permeable sheet and the first gas-impermeable sheet; sealing the three sheets together along their corresponding edges opposite the first sealed edge; applying a vacuum to the opposite side of the gas-permeable sheet to extract therethrough gas from the powdered material; and sealing the remaining edge of the second gas-impermeable sheet to the corresponding edges of the other two sheets while such vacuum continues to be applied to the gas-permeable sheet.

2. A method according to claim 1, in which the resulting partially formed package is heated during application of the vacuum to the gas-permeable sheet.

* * * * *